(12) United States Patent
Arrington et al.

(10) Patent No.: US 11,549,903 B1
(45) Date of Patent: Jan. 10, 2023

(54) ENHANCED MICROFABRICATION USING ELECTROCHEMICAL TECHNIQUES

(71) Applicant: National Technology & Engineering Solutions of Sandia, LLC, Albuquerque, NM (US)

(72) Inventors: Christian Arrington, Albuquerque, NM (US); Amber Lynn Dagel, Albuquerque, NM (US); Jamin Ryan Pillars, Albuquerque, NM (US); Christopher St. John, Albuquerque, NM (US); Jonathan Coleman, Albuquerque, NM (US); Carlos R. Perez, Albuquerque, NM (US); Andrew E. Hollowell, Albuquerque, NM (US); Kalin Baca, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 1037 days.

(21) Appl. No.: 16/244,501

(22) Filed: Jan. 10, 2019

Related U.S. Application Data

(60) Provisional application No. 62/618,746, filed on Jan. 18, 2018.

(51) Int. Cl.
*B81C 1/00* (2006.01)
*G01N 27/30* (2006.01)
(Continued)

(52) U.S. Cl.
CPC ....... *G01N 27/301* (2013.01); *B81C 1/00539* (2013.01); *C23C 18/1605* (2013.01);
(Continued)

(58) Field of Classification Search
CPC .............. G01N 27/301; B81C 1/00539; B81C 2201/0114; B81C 2201/0138;
(Continued)

(56) References Cited

U.S. PATENT DOCUMENTS 8,253,422 B2 * 8/2012 Vermeire .......... H01L 21/67028
324/525
8,375,768 B2 * 2/2013 Zeng .................. G01N 27/4162
73/24.01

(Continued)

OTHER PUBLICATIONS

Arrington, C.L. et al "Lithographic Development Endpoint Detection Using Electrochemical Techniques", Sandia National Laboratories, 2018, SAND2018-11076C.
(Continued)

*Primary Examiner* — Binh X Tran
(74) *Attorney, Agent, or Firm* — Martin I. Finston; Mark A. Dodd

(57) ABSTRACT

A method is provided for subtractively processing a layer of etchable material formed over an electrically conductive surface region of a workpiece. The workpiece is immersed in a liquid solution, generally but not exclusively a conductive solution, that comprises an etchant for the etchable material, so that etching of the etchable material is initiated. An electric circuit is connected to include a control electrode, a reference electrode, and the electrically conductive surface region of the workpiece. The electric circuit is used to monitor the development process dynamically at each of a plurality of intervals during the etching. The etching is terminated when the electrochemical signal satisfies a criterion indicating that the etching is complete.

13 Claims, 9 Drawing Sheets

(51) Int. Cl.
  *C25D 5/02* (2006.01)
  *C23C 18/16* (2006.01)
  *C25D 1/00* (2006.01)
  *G03F 7/30* (2006.01)
  *B81B 7/00* (2006.01)

(52) U.S. Cl.
  CPC .......... *C23C 18/1608* (2013.01); *C25D 1/006* (2013.01); *C25D 5/02* (2013.01); *G03F 7/30* (2013.01); *B81B 7/00* (2013.01); *B81C 2201/0114* (2013.01); *B81C 2201/0138* (2013.01); *B81C 2201/0139* (2013.01)

(58) Field of Classification Search
  CPC ........ B81C 2201/0139; C23C 18/1605; C23C 18/1608; C25D 1/006; C25D 5/02; G03F 7/30; B81B 7/00
  USPC .... 216/86, 103, 107, 108; 215/86, 103, 107, 215/108
  See application file for complete search history.

(56) References Cited

U.S. PATENT DOCUMENTS

| | | | |
|---|---|---|---|
| 9,657,226 B2* | 5/2017 | Nagamine | C23C 18/2086 |
| 2005/0155707 A1* | 7/2005 | Boehme | B29C 33/40 |
| | | | 156/345.11 |
| 2013/0256265 A1* | 10/2013 | Darling | H01L 21/3081 |
| | | | 216/49 |
| 2018/0080140 A1* | 3/2018 | Ma | H01L 21/76879 |

OTHER PUBLICATIONS

Arrington, C.L. et al. "Electrochemical Endpoint Lithography Techniques Applied to PMMA LIGA Fabrication of Xpci Gold Gratings", The Electrochemical Society, 2018, http://ma.ecsdl.org/content/MA2018-02/52/1787.abstract.

Baca, K.R. et al., "Enhanced Lithography Using an Electrochemical Technique to Monitor the Endpoint", Sandia National Laboratories, 2017, SAND2017-11039C.

Benora, P.L. et al., "Electrochemical Impedance Spectroscopy as a Tool for Investigating Underpaint Corrosion", Electrochimica Acta, 1996, pp. 1073-1082, vol. 41.

Leoni, R.E. "An electrochemical capacitance-voltage technique for the determination of pseudomorphic high electron mobility transistor material parameters", 1995, Lehigh University, dissertation.

Pan, J. et al., "Characterization of High-Temperature Oxide Films on Stainless Steels by Electrochemical-Impedance Spectroscopy", 1998, Oxidation of Metals, vol. 50.

Trethewey, K.R. et al., "Electrochemical impedance behaviour of type 304L stainless steel under tensile loading", 2004, Materials Letters, pp. 3381-3384, vol. 58.

* cited by examiner

ENHANCED MICROFABRICATION USING ELECTROCHEMICAL TECHNIQUES

CROSS-REFERENCE TO RELATED APPLICATION

This application claims the benefit of priority to U.S. Provisional Patent Application No. 62/618,746, filed Jan. 18, 2018, under the title "Enhanced Microfabrication Using Electrochemical Techniques", the entire contents of which are incorporated herein by reference.

STATEMENT OF GOVERNMENT INTEREST

This invention was made with Government support under Contract DE-NA0003525 awarded by the United States Department of Energy/National Nuclear Security Administration. The U.S. Government has certain rights in the invention.

FIELD OF THE INVENTION

The invention relates to methods and apparatus for controlled etching of materials, and more particularly to wet etching to form patterned microstructures.

ART BACKGROUND

The practice of semiconductor lithography relies heavily on the use of photoresists. A photoresist is typically deposited as a thin layer on a substrate and exposed to radiation through a pattern-bearing mask in order to transfer the pattern to a latent image within the photoresist. The photoresist is then developed by exposing it to an agent that removes either the exposed portions or the unexposed portions of the photoresist.

In currently used methods for developing photoresists, the endpoint for photoresist development is typically controlled by directly controlling the process time. That is, after a predetermined process time that is typically minutes in length, visual and microscopic inspections are performed to verify whether the development process is complete.

In microfabrication techniques such as LIGA, which target high-aspect-ratio features, the time durations may be increased to hours. Even with microscopic inspection, it might not be possible to discern whether the development process has been completed.

If the development process is found to be incomplete and more time is needed, the steps of timed development, trial electroplating, and inspection can be iterated to yield the desired result.

The initial process time is optimized through experimentation based on how well the resulting profile conforms to design requirements. The optimized time is then used in a production capacity. Over time, however, process drift may lead to overdevelopment or underdevelopment, both of which can lead to an unsatisfactory product that needs to be reprocessed. Factors that contribute to process drift include saturation of the developer with photoresist, small changes in exposure dose, humidity, and changes in the chemical composition of the photoresist. All these dynamic factors increase the production costs of microelectronics.

Because trial and error are involved, processes of the kind described above are imperfect. If more accurate measurements could be introduced, and if they could be automated, there would be improvements in quality, throughput, reliability, economy, and consistency of fabricated microelectronic devices.

SUMMARY OF THE INVENTION

We have developed a new method for determining the endpoint of a photoresist development process, and more generally for measuring the progress of a chemical wet etching process. Our new method can potentially detect the endpoint with high accuracy, and it can be automated.

Accordingly, our invention in one aspect involves a method for subtractively processing a layer of etchable material formed over an electrically conductive surface region of a workpiece. According to our new method, the workpiece is immersed in a liquid solution, generally but not exclusively a conductive solution, that comprises an etchant for the etchable material, so that etching of the etchable material is initiated. An electric circuit is connected to include a control electrode which for purposes of DC measurements may in some cases be referred to as an "anode", a reference electrode, and the electrically conductive surface region of the workpiece. This creates an electrochemical cell setup. The circuit is electrochemical in that it further includes a current path through the liquid solution, by virtue in at least some cases of the addition of conducting salts to the solution.

The electric circuit is used to monitor the development process dynamically at each of a plurality of intervals during the etching. That is, an electrical signal is measured at each of the intervals. An example electrical signal would be the impedance signature of the workpiece. The etching is terminated when the electrochemical signal satisfies a criterion indicating that the etching is complete.

In embodiments, the method also includes one or more rinse cycles during which the workpiece is rinsed, and during which further measurements of, e.g., the electrochemical impedance signature is made. Under circumstances that prohibit adding conductive salts to the developer chemistry, the development of the sample can be monitored iteratively by returning to the (suitably conductive) rinse bath for each electrical measurement.

In embodiments, an inorganic salt is added to the liquid etchant solution to make it more electrically conductive before immersing the workpiece.

In embodiments, the electrochemical impedance signature is a representation of a frequency response of the electrochemical circuit. Such a representation may be a Bode plot, in which the magnitude and phase of the electrochemical impedance are graphed as functions of frequency. Alternatively, the representation may be a Nyquist plot, in which frequency is implicit and the magnitude and phase are the respective coordinates of each plotted point. In at least some cases, it will be useful to select a single variable, such as the magnitude of the electrochemical impedance, as the variable to be plotted. In at least some cases, a derived quantity, such as the rate of change of the magnitude of the electrochemical impedance, may provide a useful signature.

In embodiments, the etchable material is poly(methyl methacrylate), also referred to herein as "PMMA".

In embodiments, the liquid etchant solution comprises LIGA solution, which is also sometimes referred to as "GG Developer". LIGA solution is a mixture of 2-(2-butoxyethoxy) ethanol, morpholine (tetrahydro-1,4-oxazine), ethanolamine (amino-ethanol), and water.

In embodiments, the etchable material is an exposed photoresist, and the etching is performed so as to form grooves or pores with a feature size of 0.05-5 µm and an aspect ratio of 50-200. By "feature size" in this regard is meant the smallest patterned diameter or width in the plane parallel to the substrate or perpendicular to the depth axis of the groove or pore. By "aspect ratio" is meant the ratio of the depth of the groove or pore to its feature size.

In embodiments, the method is carried out within an electrochemical cell in such a way that the workpiece remains continuously within the electrochemical cell through all of the etching, from etch initiation to etch termination.

In another aspect, our invention relates to a processing tool comprising a potentiostat, an impedance analyzer, and an etch chamber. (A commercial off-the-shelf potentiostat will typically include the functionality of the impedance analyzer.) The processing tool also includes, within the etch chamber, a control electrode of an electrochemical cell and a reference electrode of the electrochemical cell. A mounting bracket for mounting a workpiece is also included so that in operation, at least a face portion of the workpiece is in contact with an electrolyte filling the etch chamber. A connector is included for connecting to an electrically conductive portion of the workpiece and incorporating the electrically conductive portion as a working electrode in the electrochemical cell.

The potentiostat is configured to maintain the control electrode at a controllable electrical potential relative to the reference electrode when in operation, and the impedance analyzer (typically as a functionality of the potentiostat) is configured to measure an electrochemical impedance of the workpiece. The tool also includes a control circuit configured to operate the potentiostat and the impedance analyzer so as to generate an impedance spectrum of the workpiece at repeated intervals during processing of the workpiece. (The control circuit may also be included as a functionality within the potentiostat.)

In embodiments, the control circuit is configured to apply an alternating electrical potential having a controlled frequency to the control electrode. The applied potential is held constant relative to the reference electrode. For generating the impedance spectra, the controlled frequency is scanned over a frequency range from approximately DC to a maximum frequency that may be as small as several hertz or as high as several hundred kilohertz or more.

In embodiments, at least one liquid inlet and at least one liquid outlet are arranged so that the electrochemical cell can be filled, drained, and refilled without removing the workpiece from its mounting bracket.

DETAILED DESCRIPTION

LIGA is a fabrication technology useful for making high-aspect-ratio structures. LIGA has three stages: Lithography (the "LI" in the acronym) involves patterning a resist bonded to a substrate by exposure to x-radiation or ultraviolet radiation through a mask and then developing the resist so that pores or grooves are opened. Electroplating ("Galvanoformung"; the "G" in the acronym) involves filling the pores or grooves with an electrodeposited metal such as copper, nickel, or gold using the substrate (or a conductive seed layer deposited over an insulative substrate) as the cathode in an electroplating cell. After the electroplating is completed, the resist is stripped away to leave a metal mold that can be used in processes such as injection molding. This molding operation ("Abformung"; the "A" in the acronym) is the third stage of the LIGA technology.

Figure 1:
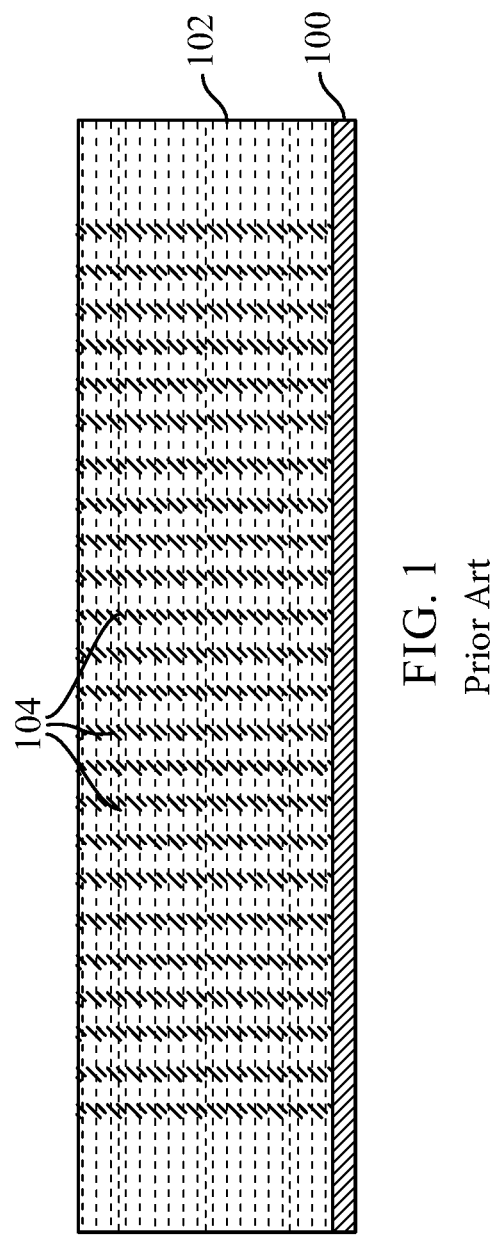
FIGS. 1-3 are cross-sectional diagrams illustrating the lithography and electroplating stages of a LIGA process.
Figure 2:
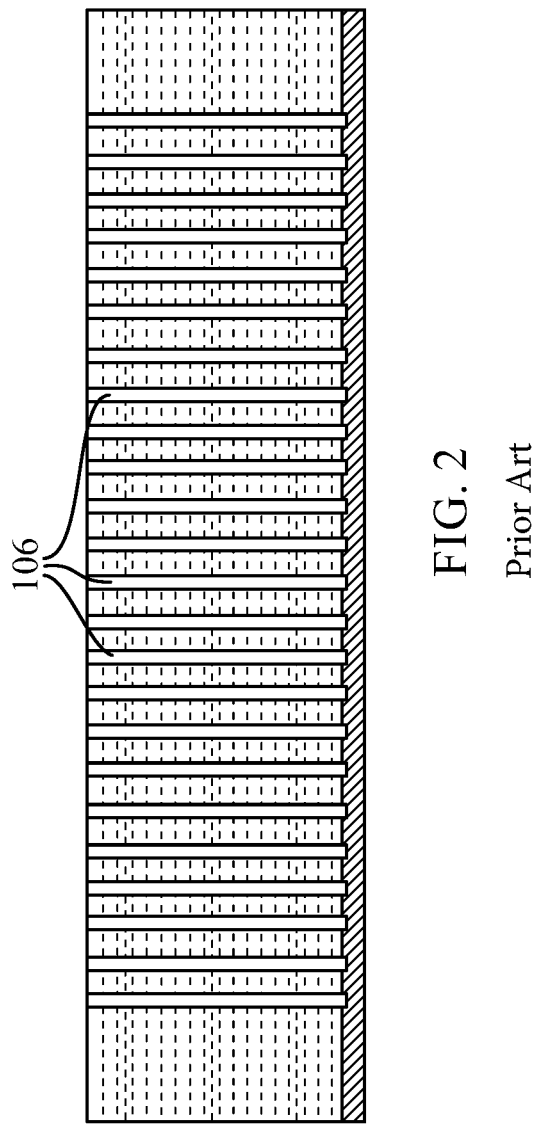
Figure 3:
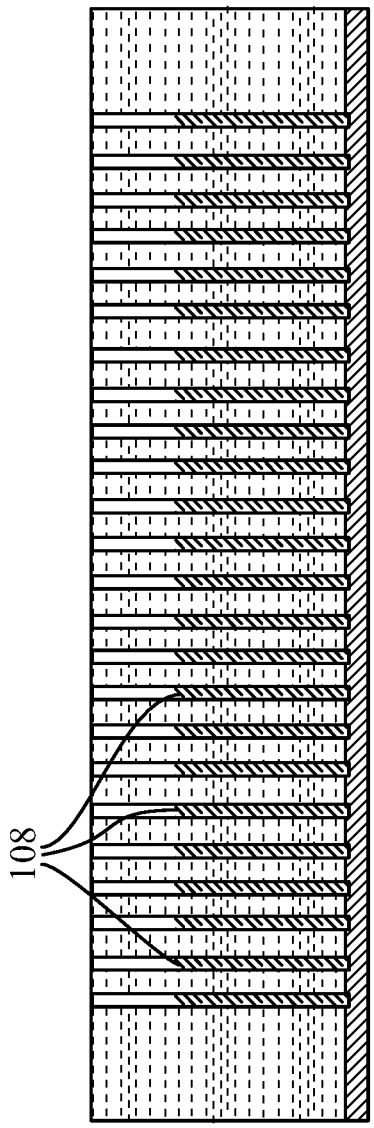

FIGS. 1-3 are cross-sectional diagrams illustrating the lithography and electroplating stages. In FIG. 1, a workpiece is shown having a conductive substrate 100 overlain by a layer 102 of resist. The resist has already been exposed to radiation, for example by exposing it to a beam from an x-ray source through a gold grid. The regions 104 exposed through the grid openings are indicated in the figure.

FIG. 2 is a view of the workpiece after the resist has been developed. As seen, the exposed regions have been removed, leaving a series of grooves 106.

FIG. 3 is a view of the workpiece partway through the process of electroplating. As seen in the figure, each of the grooves is now partially filled by a column 108 of electrodeposited metal.

A typical LIGA substrate is a slab of silicon or glass overlain by a metal seed layer such as a titanium/gold/titanium trilayer. A typical LIGA photoresist material is PMMA.

Development of the PMMA photoresist for making a LIGA mold faces all of the problems listed above that are associated with photoresist development. In addition, feature sizes of 1 µm or less are typical; as well, etch depths of 10 µm to 2 mm (leading to an aspect ratio of 10-2000 for a 1-µm-diameter hole) are typical. With such small feature sizes and high aspect ratios, visual and microscopic verification of the endpoint are difficult if not impossible to see.

We investigated several electrochemical techniques for their possible use in monitoring the development of PMMA photoresists. Our results were promising, as discussed below, and they point the way toward practical applications in microfabrication of high-aspect-ratio features and features in microelectronics that are difficult to see.

The range of potential applications is not limited to LIGA technology or to a PMMA resist material. Rather, we believe that there are broad applications to subtractive processing of films and layers in electrochemically active liquids, i.e., in liquids that are electrically conductive or that form polarized interfacial layers with immersed metal surfaces. Some examples would be microelectronics, e-beam lithography, and stereolithography processes.

Figure 4:
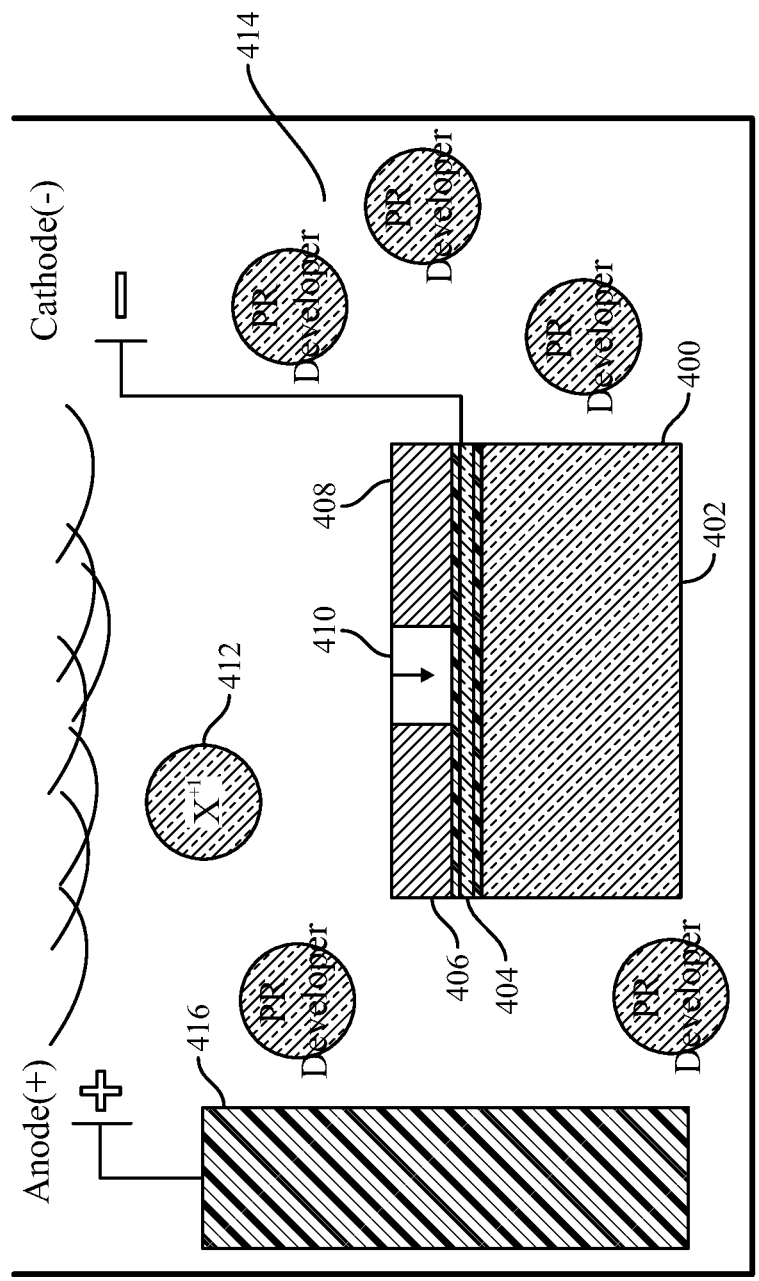
FIG. 4 illustrates a notional electrochemical cell for the electrochemical monitoring of resist development. The reference electrode, which is normally required in an electrochemical call, has been omitted for clarity.

FIG. 4 illustrates a notional electrochemical cell for the electrochemical monitoring of resist development. (As noted above, the reference electrode has been omitted for clarity.) As seen in the figure, a workpiece 400 includes a silicon or glass substrate 402 with a thin layer metal seed layer 404 and photoresist (PR) mold 406 on top. Portion 408 of the photoresist remains behind after exposure to the developer, whereas portion 410 is developed out as in conventional lithographic processing. Depending on the choice of monitoring technique, an electrical potential may be applied to the conductive solution to make an electrochemical bridge between the metal seed layer, platinized titanium mesh, and reference electrode 416, or a potential may be measured between the seed layer and the mesh.

Conductive salts such as $X^{+1}$ cation salts 412 are added to the developer chemistry to facilitate the probing of the interaction between the developer solution 414 and the conductive surface. Such salts are helpful because they improve electrical conductivity, produce electrochemical polarization at the interface of the electrolyte with the surface of the conductive substrate, and react reversibly at the electrode interfaces. This enables the interaction to be probed from a distance without undesirable chemical reactions and without interference with the development process.

Open circuit measurements can be used to detect changes in surface interactions and in the developer chemistry. In these measurements, an open circuit voltage is measured between the seed layer and the mesh electrode 416 without current flow.

In chronoamperometry, a potential is applied between the seed layer and the mesh electrode in a series of discrete voltage steps. The current is measured while stepping the voltage. From the current measurements, it is possible to determine, during each voltage step, a transition time defined as the time it takes for the concentration of the reducible species to drop to zero at the sample surface. Given known bulk concentrations, the electroactive surface area can be calculated from the transition times. These calculations can be directly compared to mask layouts in order to facilitate more precise development.

Chronoamperometry can also be used in conjunction with electrochemical etching to remove a sacrificial conducting seed layer at the bottom of the photoresist mold. Using calibration samples of known seed layer thickness, the amount of seed layer that has been removed can be accurately correlated with current measurements.

In other applications of chronoamperometry, adsorption of the active species in the bath chemistry to the surface of the substrate is promoted by applying an electric charge to the conducting seed layer. In some cases, this can be done to inhibit further development of the mold, thereby preventing the mold from being undercut by overdevelopment.

In Electrical Impedance Spectroscopy, a sinusoidal voltage waveform is applied to the surface of the substrate and varied over a range of frequencies. An example of such a waveform is a 10 mV sine wave. By measuring the impedance and phase angle between the voltage and the resulting current, electrochemical surface interactions between the sample and the bath chemistry can be examined. In particular, the charge-transfer resistance can be characterized in this manner, and the interfacial double layer capacitance can be measured with a precision in the range of single-digit microfarads. A change in the transfer resistance of electrons moving between the solid phase (sample) and the liquid phase (bath chemistry) can be correlated with the complete development of the sample.

Figure 9:
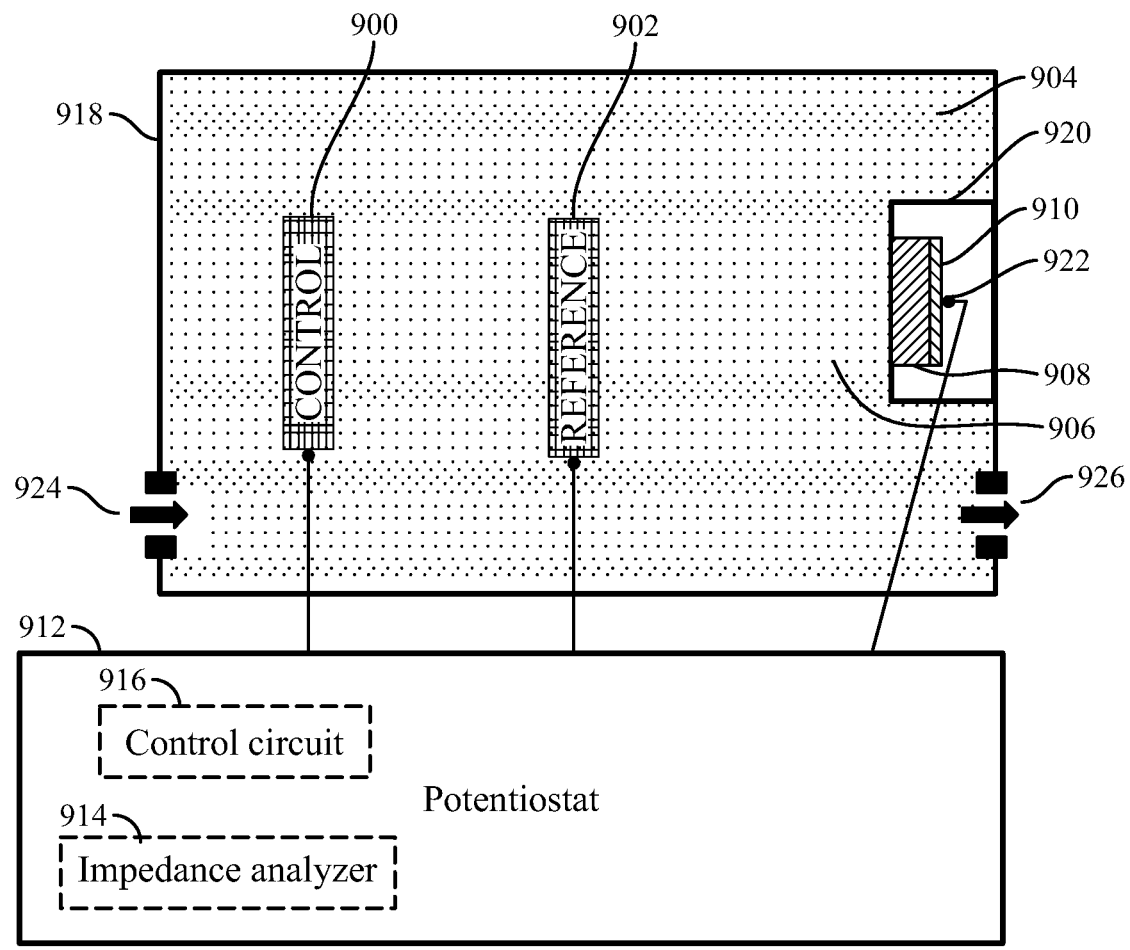
FIG. 9 notionally shows an arrangement for an electrochemical cell setup that is useful for measurements of the kinds we describe here.

Looking ahead to FIG. 9, there will be seen an arrangement for an electrochemical cell that is useful for the kinds of measurements described above. As seen, a control electrode 900 and a reference electrode 902 are immersed in the developer bath 904. At least the face of workpiece 906 is exposed to the bath, so that developer solution can penetrate through openings in resist layer 908 down to conductive substrate 910 (or to a conductive seed layer on the substrate). The control electrode may be referred to as an "anode" by analogy to electrodeposition systems, although in alternating-current techniques such as electrical impedance spectroscopy it does not have a fixed polarity.

Potentiostat 912 applies a voltage between the control electrode and the substrate and monitors interactions at a reference electrode. The potentiostat is arranged to maintain a programmable voltage (or voltage amplitude, for periodic waveforms) between the control electrode and the reference electrode.

Thus, the current path through the cell circuit includes the control electrode, the bath, the workpiece substrate (or the seed layer on the substrate), and the potentiostat. An impedance analyzer circuit 914, which is typically included as a functionality within the potentiostat 912, can measure the frequency response of the cell circuit and provide impedance spectra. A control circuit 916, which is also typically included as a functionality within the potentiostat 912, can be used to program the shape, frequency, and amplitude of the desired waveform. In particular, the potentiostat (through control circuit 916) controls the frequency scan for taking impedance spectra. A typical scan range is from approximately DC to a maximum frequency in the range 1 Hz to 1 kHz.

We performed a series of experiments using an arrangement such as the arrangement of FIG. 9. Our anode was an electrode of platinized titanium mesh. We initially used a silver/silver chloride reference electrode, but later substituted a platinized titanium mesh as a quasi electrode, as this gave satisfactory performance while avoiding possible measurement ambiguities caused by the migration of ions associated with the compound electrode. The face of the workpiece, i.e. the upper surface of the PMMA resist, was in direct contact with the developer bath and the connection to the substrate was outside the solution. To prevent spurious results, the sides and bottom of the workpiece were passivated by coating them with epoxy.

In our experiments, we used four trial compositions for the developer bath in which inorganic salts were added to LIGA mixture. The additives were potassium chloride (KCl) at a concentration of 10 mM, sodium chloride (NaCl) at a concentration of 10 mM, KCl at a concentration of 100 mM, and NaCl at a concentration of 100 mM. Although qualitatively similar results were found in all cases, we settled on NaCl (100 mM) as the most satisfactory composition among those that we tried.

The simple monovalent salts NaCl and KCl were of particular interest because of their relatively high solubility in many solvents. This is important because many etchants and developer solutions are non-aqueous or only partially aqueous and have correspondingly low solubilities for ionic compounds.

Open circuit voltage measurements confirmed that for all four trial solutions, the added salts facilitated electrochemical measurements without causing irreversible reactions. Cyclic voltammetry using an Ag/AgCl reference electrode and a potential range of −500 to 500 mV also indicated there were no irreversible reactions, and also confirmed that all four trial solutions were electrochemically sensitive to the exposed conductive area of the seed layer but insensitive to the sample masked by resist.

Chronoamperometry was investigated at an applied potential of −0.1V. For our specific application, we found that the sensitivity of this technique for endpoint detection was low relative to our preferred technique of potentiostatic electrochemical impedance spectroscopy (PEIS), which is discussed below.

Figure 5:
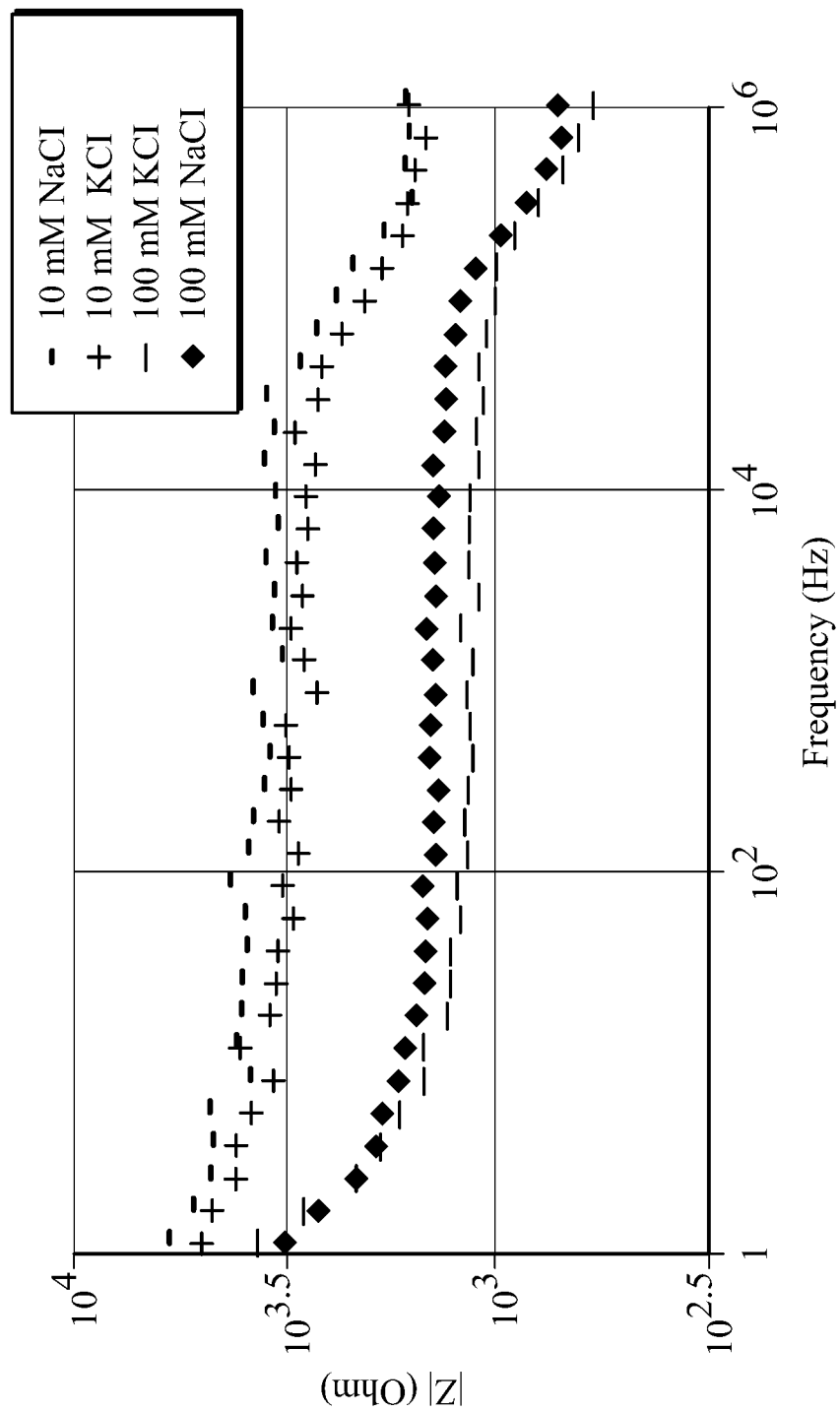
FIG. 5 is a Bode plot showing the magnitude of cell impedance as a function of frequency for a representative electrochemical circuit of the kind that we describe here.

PEIS is a type of electrical impedance spectroscopy in which the electrical impedance of an electrochemical cell is measured as a function of frequency using a potentiostat and an impedance analyzer. FIG. 5 is a Bode plot showing the magnitude of the cell impedance as a function of frequency from 1 Hz to 1 MHz. Four spectra are shown. From top to bottom, they correspond to the following additives: NaCl (10 mM), KCl (10 mM), NaCl (100 mM), and KCl (100 mM). We found that PEIS measurements are very sensitive to small changes in the exposed area of the seed layer. It should also be noted that the impedance scale in FIG. 5 is a logarithmic scale, so the distinctly visible differences between the various trial compositions are in fact quite large.

Figure 6:
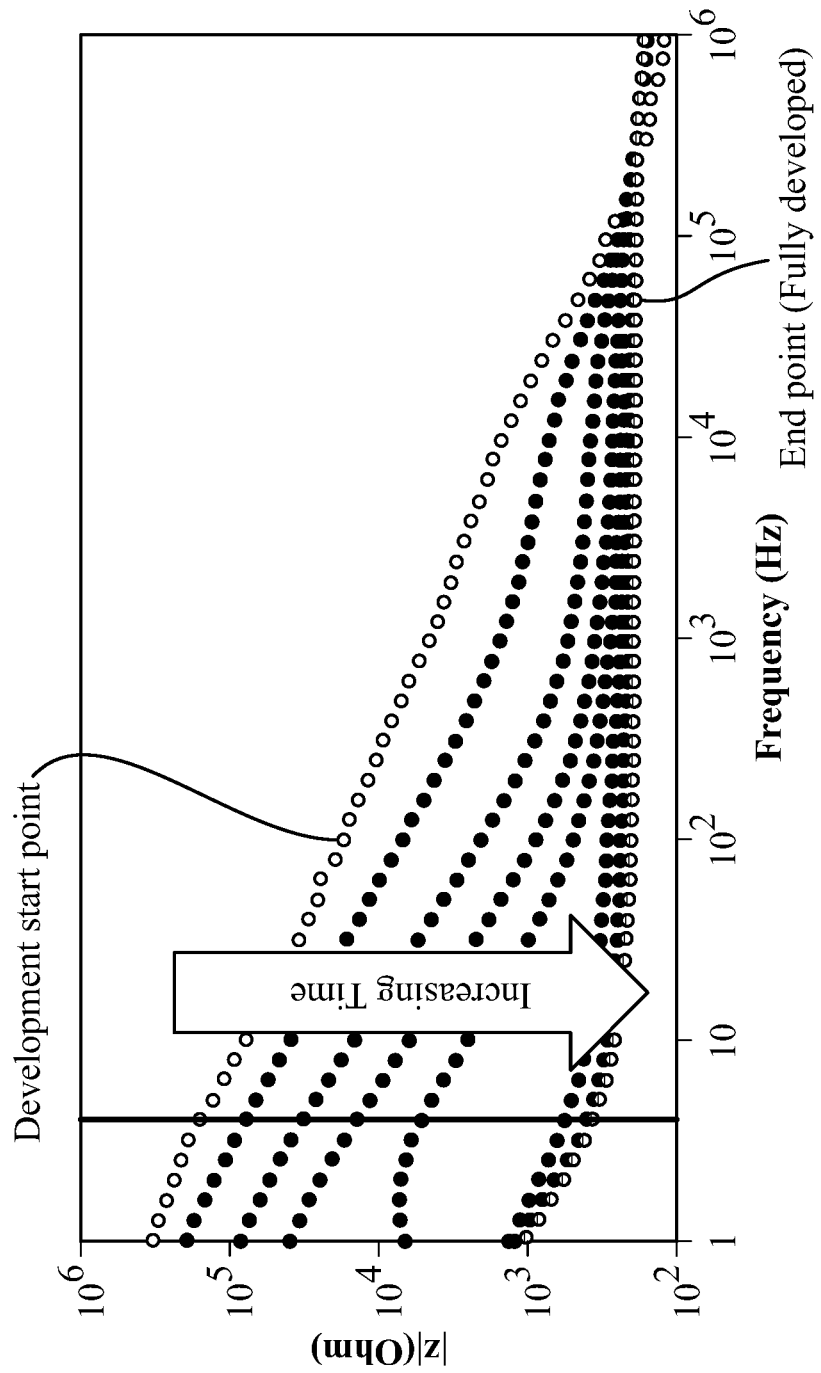
FIG. 6 is a series of eight Bode magnitude plots illustrating the active monitoring of a PMMA sample as it is developed out in a solution of conductive salt and developer.

FIG. 6 is a series of eight Bode magnitude plots taken at different times during the development of a PMMA resist over a substrate having a Ti/Au/Ti seed layer. The bath contains NaCl (100 mM) and is maintained at a temperature of 39° C. Development time increases from the top plot toward the bottom plot. The topmost plot was taken at development start time, and the bottommost plot was taken at the endpoint. A vertical bar superimposed on the figure indicates a frequency of 3.98 Hz, which is referred to in the next two figures.

Figure 7:
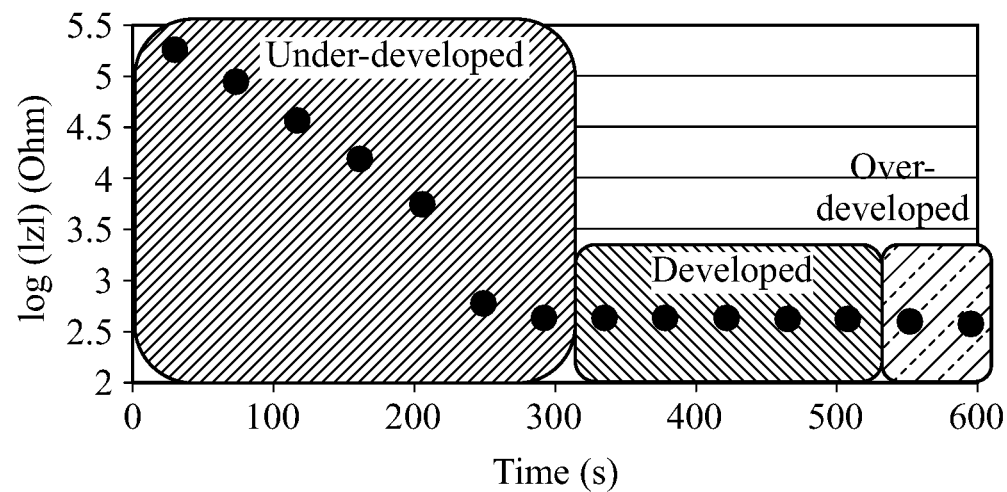
FIG. 7 is a graph, derived from the data of FIG. 6, in which the impedance magnitude is plotted as a function of development time from zero to 600 seconds. Three regimes are indicated in the figure: Developing, Developed, and Overdeveloped.

FIG. 7 is a graph, derived from the data of FIG. 6, in which the logarithm (log (|Z|)) of the impedance magnitude is plotted as a function of development time from zero to 600 seconds. Three regimes are discernable in the figure: Underdeveloped, Developed, and Overdeveloped. In the underdeveloped regime, ongoing development of the sample is indicated by the falling value of the measured impedance. As seen in the figure, the impedance drops during development from more than 100 kΩ to less than 1 kΩ An endpoint is seen in the falling trajectory at 336 seconds of development time, where the measured impedance levels off. The measured impedance is seen to be flat in the Developed regime. In the Overdeveloped regime, however, a further decrease in the impedance is observed. Our current understanding is that the further decrease is due to etching away of unexposed PMMA photoresist by the developer solution.

Figure 8:
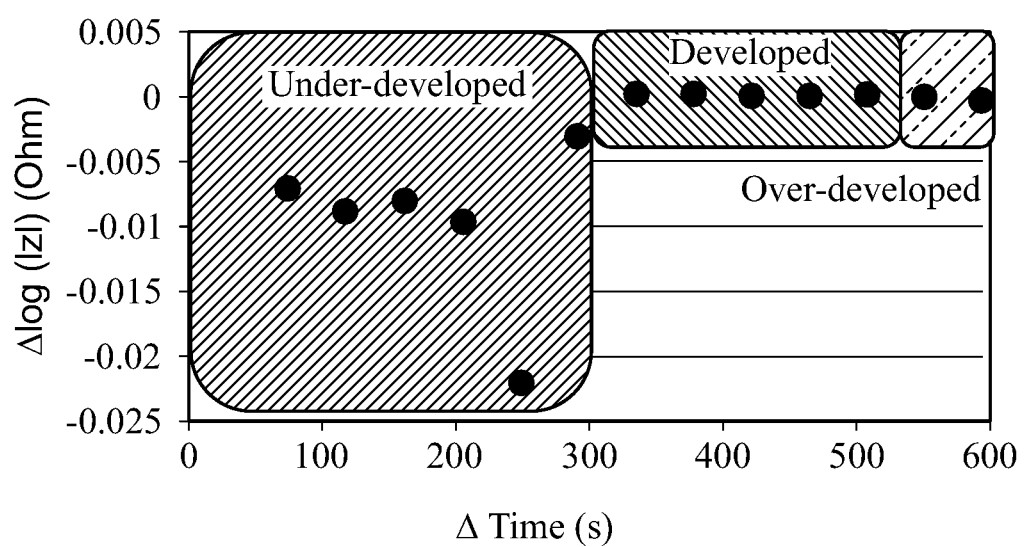
FIG. 8 is a graph, derived from the data of FIG. 6, in which the slope, i.e. the time derivative, of the impedance magnitude is plotted as a function of development time from zero to 600 seconds. The three regimes indicated in FIG. 7 are also indicated in FIG. 8.

FIG. 8 is a graph, derived from the data of FIG. 6, in which the slope, i.e. the time derivative, of log (|Z|) is plotted as a function of development time from zero to 600 seconds. The three regimes indicated in FIG. 7 are also discernable in FIG. 8. The endpoint seen in the preceding figure at 336 seconds of development time is marked in FIG. 8 by a transition from negative slope to zero slope as the impedance levels off. The onset of the Overdeveloped regime is also discernable as the point where the slope again goes negative.

FIGS. 6 and 7 provide an example in which a Bode magnitude plot is the electrochemical impedance signature that provides a representation of a frequency response of the electrochemical circuit and that is used for endpoint detection. FIG. 8 provides an example in which a derived quantity, in this case the rate of change of the impedance magnitude, provides the signature.

Although we have found the Bode magnitude plot to be especially convenient, any of various other signatures, such as Nyquist plots, may alternatively be used. Moreover, any of various quantities derived from the raw impedance, such as the slope as shown in FIG. 8, may provide a useful signature.

We believe that by using techniques as described above, development endpoints can be accurately detected in workpieces having feature sizes of 5 μm or less, even down to feature sizes of 0.05 μm or even less, and with aspect ratios of 50 or more, even as high as 200 or even more.

Turning again to FIG. 9, it will be seen that the developer bath is disposed within an etch chamber 918. A suitable etch chamber may be adapted, for example, from designs for existing process tanks used for wet etching or electrochemical deposition in the semiconductor processing industry.

It will be seen further that the etch chamber is equipped with a mounting bracket 920 for mounting the workpiece so that at least a face portion of the workpiece is in contact with the bath. Also seen is a connector 922 for connecting to an electrically conductive portion of the workpiece and incorporating the electrically conductive portion as a working electrode in the electrochemical cell.

The etch chamber of FIG. 9 is also provided with a liquid inlet 924 and a liquid outlet 926, arranged so that the etch chamber can be filled, drained, and refilled without removing the workpiece from its mounting bracket. The workpiece, or at least its facial portion, can thus remain continuously within the etch chamber through all of the etching, from etch initiation to etch termination, even if the etching is interrupted by rinsing steps.

Figure 10:
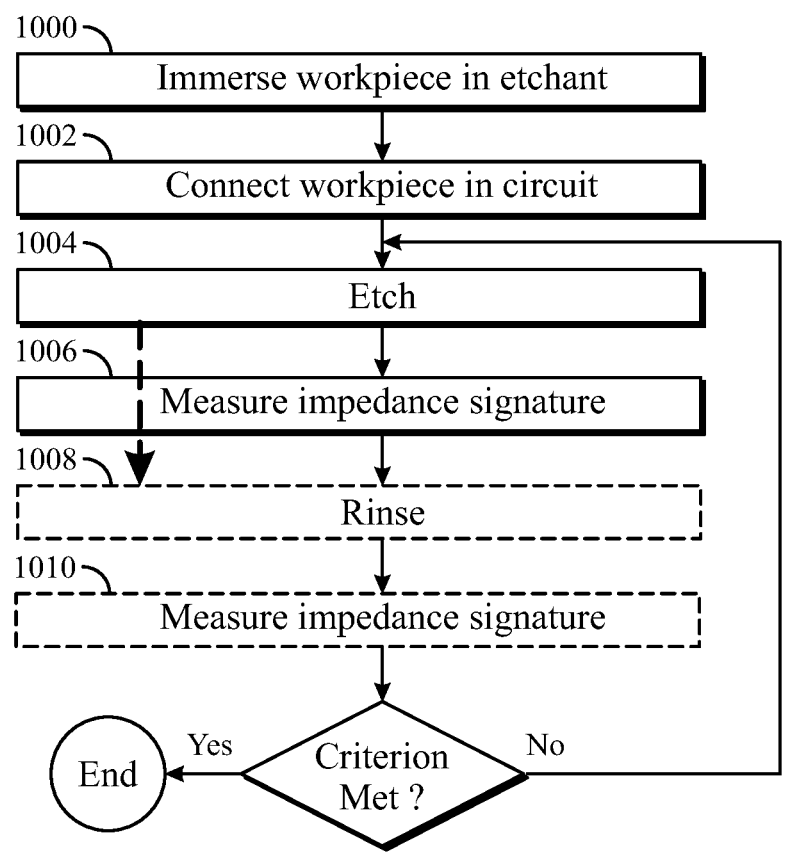
FIG. 10 is a flowchart of a sequence of steps that may be performed using an etch chamber and electrochemical cell such as those of FIG. 9.

FIG. 10 is a flowchart of a sequence of steps that may be performed using an etch chamber and electrochemical cell such as those of FIG. 9. According to the illustrated sequence, the workpiece is immersed 1000 in the developer bath and connected 1002 in the electrochemical cell circuit. Once the workpiece comes into contact with the developer, etching 1004 commences. At repeated intervals during the development, the impedance signature of the cell is measured 1006.

Optionally, the chamber is drained and refilled with a rinse liquid to rinse 1008 the workpiece, and the impedance signature is measured 1010 in the rinse liquid. Some or all of the impedance signatures are compared against a criterion for detecting the development endpoint. If the criterion is not met, the process is iterated for a new etch-and-measurement cycle.

As indicated by the broken arrow from step 1004 to step 1008 (bypassing step 1006), the measurement of the impedance signature may, in variations of this process, be confined to the rinse bath. This is useful, for example, when the developer chemistry does not allow for the addition of ionic compounds to make it conductive. Impedance (or other electrical) measurements in the rinse bath also offer the potential advantage that they are simpler to interpret because they are made without concurrent etching.

We claim:
1. A method for subtractively processing a layer of etchable material formed over an electrically conductive surface region of a workpiece, comprising:
connecting the workpiece in an electrochemical circuit that includes a control electrode, a reference electrode, and the electrically conductive surface region of the workpiece;

immersing at least a portion of the workpiece in a liquid solution that comprises an etchant for the etchable material, so that etching of the etchable material is initiated;

dynamically monitoring the etching of the etchable material at each of a plurality of intervals between the initiation of the etching and an endpoint of the etching, wherein the dynamic monitoring comprises measuring an electrical signal in the electrochemical circuit;

performing a plurality of rinse cycles, wherein the etching is interrupted, and the workpiece is rinsed during each of the rinse cycles;

measuring the electrical signal in the electrochemical circuit during each rinse cycle for dynamic monitoring of the etching, measurement of the electrical signal for dynamic monitoring being performed during the rinsing but not during the etching; and terminating the etching when the electrochemical signal satisfies a criterion indicating that the endpoint has been reached.

2. The method of claim 1, wherein the measuring of the electrical signal comprises measuring an impedance signature of the workpiece.

3. The method of claim 1, wherein the measuring of the electrical signal comprises measuring a magnitude of electrochemical impedance.

4. The method of claim 1, wherein the measuring of the electrical signal comprises measuring a rate of change of a magnitude of electrochemical impedance.

5. The method of claim 1, wherein the etchable material is poly(methyl methacrylate).

6. The method of claim 1, wherein the liquid etchant solution comprises LIGA solution.

7. The method of claim 1, wherein the etchable material is an exposed photoresist, and the etching is performed so as to form grooves or pores with a feature size of 0.05-5 µm and an aspect ratio of 50-200.

8. The method of claim 1, wherein the workpiece remains continuously within an electrochemical cell through all of the etching, from etch initiation to etch endpoint.

9. The method of claim 1, wherein during the dynamic monitoring, the electrochemical circuit includes a current path through the liquid solution that comprises the etchant.

10. The method of claim 9, further comprising adding conducting salts to the liquid solution that comprises the etchant prior to the dynamic monitoring.

11. The method of claim 1, wherein the measuring of the electrical signal comprises measuring an impedance signature of the workpiece, and the electrochemical impedance signature is a representation of a frequency response of the electrochemical circuit.

12. The method of claim 11, wherein the representation of a frequency response of the electrochemical circuit is a Bode plot.

13. The method of claim 11, wherein the representation of a frequency response of the electrochemical circuit is a Nyquist plot.

* * * * *